(12) United States Patent
Errico et al.

(10) Patent No.: US 11,742,789 B2
(45) Date of Patent: Aug. 29, 2023

(54) CURRENT MONITOR CIRCUIT, CORRESPONDING SYSTEM AND METHOD

(71) Applicant: STMicroelectronics S.r.l., Agrate Brianza (IT)

(72) Inventors: Nicola Errico, Rho (IT); Vanni Poletto, Milan (IT); Paolo Vilmercati, Voghera (IT); Marco Cignoli, Pavia (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 30 days.

(21) Appl. No.: 17/535,176

(22) Filed: Nov. 24, 2021

(65) Prior Publication Data

US 2022/0200509 A1    Jun. 23, 2022

(30) Foreign Application Priority Data

Dec. 23, 2020    (IT) ........................ 102020000032042

(51) Int. Cl.
*H02P 27/12*    (2006.01)
*H02P 27/08*    (2006.01)

(52) U.S. Cl.
CPC ............ *H02P 27/12* (2013.01); *H02P 27/085* (2013.01)

(58) Field of Classification Search
CPC . H02P 27/12; H02P 27/085; G01R 19/16585; G01R 31/006; G01R 19/25; H03K 7/08

USPC ............................... 318/400.02, 400.01, 700
See application file for complete search history.

(56) References Cited

U.S. PATENT DOCUMENTS

| | | | |
|---|---|---|---|
| 8,084,972 B2 * | 12/2011 | Strong | H02P 27/08 318/400.01 |
| 10,093,348 B2 * | 10/2018 | Hales | H02P 5/74 |
| 2009/0299592 A1 | 12/2009 | Oehler et al. | |
| 2018/0302008 A1 | 10/2018 | Mori et al. | |

FOREIGN PATENT DOCUMENTS

| | | |
|---|---|---|
| CN | 108696231 A | 10/2018 |
| WO | 2014060787 A1 | 4/2014 |

* cited by examiner

*Primary Examiner* — David Luo
(74) *Attorney, Agent, or Firm* — Slater Matsil, LLP

(57) ABSTRACT

In an embodiment, an electronic circuit includes: a controller configured to produce a pulse-width-modulated (PWM) signal to control a first current of an electrical load; a redundant current measurement circuit configured to measure the first current and provide first and second current measurement signal; a monitor circuit coupled to the redundant current measurement circuit, the monitor circuit configured to assert a current monitor signal in response to the first and second current measurement signals being found to be matching with each other, wherein the monitor circuit is configured to: detect an absence of the asserted current monitor signal prior to expiry of a threshold time interval, and in response to detecting the absence of the asserted current monitor signal, force the controller to produce, prior to expiry of the threshold time interval, a first PWM signal pulse having a controlled duty-cycle.

20 Claims, 3 Drawing Sheets

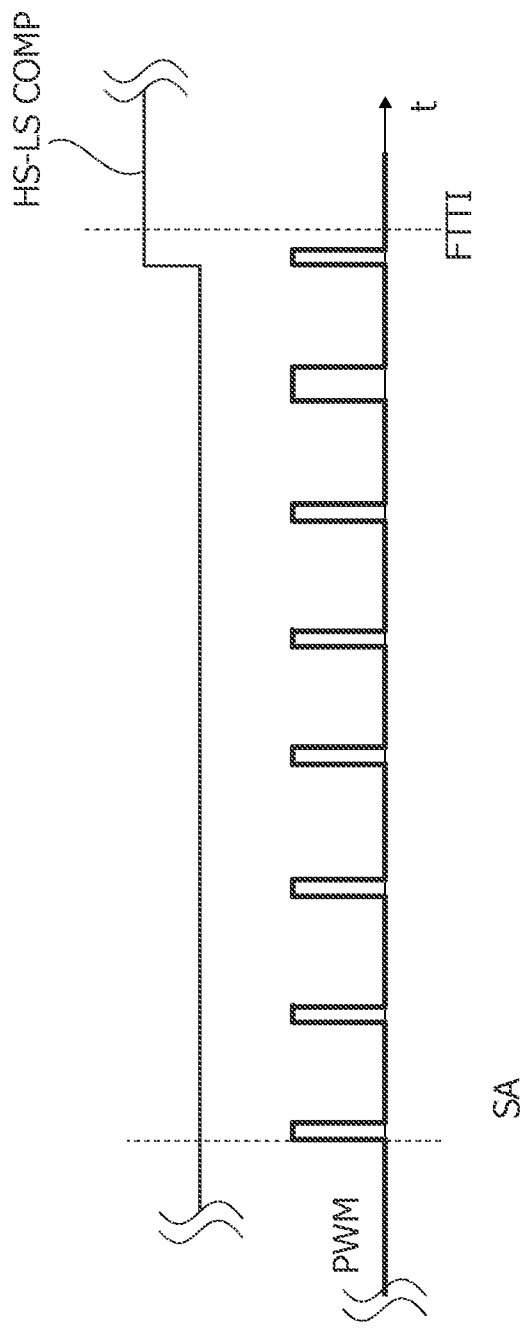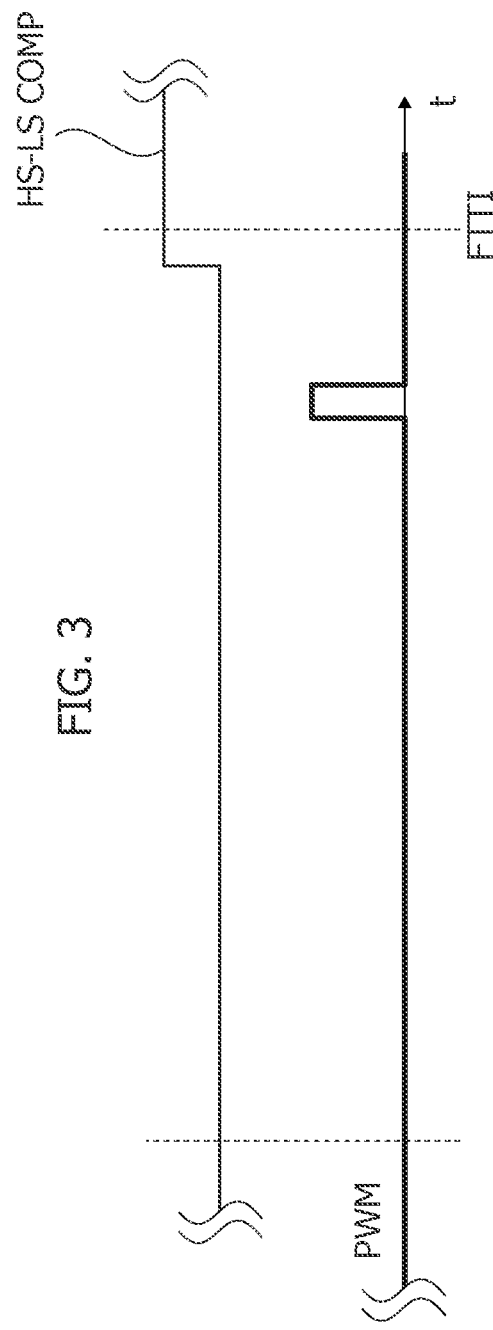

CURRENT MONITOR CIRCUIT, CORRESPONDING SYSTEM AND METHOD

CROSS-REFERENCE TO RELATED APPLICATIONS

This application claims the priority benefit of Italian patent application no. 102020000032042, filed on Dec. 23, 2020, which application is hereby incorporated herein by reference.

TECHNICAL FIELD

The present disclosure relates generally to an electronic system and method, and, in particular embodiments, to a current monitor circuit, corresponding system and method.

BACKGROUND

Specifications such as ISO26262—Functional Safety for Road Vehicles define a risk classification scheme, referred to as ASIL (Automotive Safety Integrity Level), which is helpful in defining safety specifications in line with ISO 26262. The ASIL scheme is established by performing a risk analysis of a potential hazard by looking at the severity, exposure and controllability of the operating scenario of a vehicle.

There are currently four ASIL categories: ASIL A, ASIL B, ASIL C, ASIL D, where ASIL D dictates the highest integrity specification and ASIL A the dictates the lowest.

Fairly stringent specifications like ASIL-D apply to devices used in the automotive sector, such as High-Side/Low-Side (HS-LS) drivers used to drive an electrical load such as a solenoid load (a solenoid valve, for instance) with a current regulated by resorting to Pulse-Width-Modulation (PWM).

In these drivers, compliance with specifications can be facilitated by providing a redundant current measurement path and a monitor configured to check the main current measurement path versus the redundant current measurement path.

Redundancy can be applied in different ways (HS-LS comparison, for instance). Whatever the implementation adopted for the redundant current monitor, an intrinsic limitation may arise when PWM modulation reaches "corner DC" conditions, that is, in the presence of a duty-cycle close to 0% or close to 100%.

In some embodiments, a duty-cycle of 5% or lower is considered close to 0%. In some embodiments, a duty cycle of 95% or higher is considered close to 100%.

As is known, "duty-cycle" denotes the ratio TON/(TON+TOFF) of the time TON a PWM signal is on, or active, to the period of the PWM signal, that is the sum of the time TON and the time TOFF the PWM signal is off, or inactive.

These "corner" conditions militate against providing a reliable redundant current measurement in so far as the current measurement path becomes unable to provide adequate measurement as desired, for instance a redundant current measurement within a time interval FTTI (Fault Tolerant Time Interval) around 20 ms.

SUMMARY

The description relates to techniques for monitoring currents.

One or more embodiments may be applied in on-state and off-state diagnosis of redundant current monitors.

Some embodiments advantageously address the issues outlined previously.

Some embodiments advantageously address the issues outlined previously by using a circuit having the features set forth in the claims that follow.

One or more embodiments may relate to a corresponding system. A valve drive system for use in the automotive sector may be exemplary of such a system.

One or more embodiments may relate to a corresponding method.

The claims are an integral part of the technical teaching provided herein in respect of the embodiments.

One or more embodiments may involve valve driver blocks which can be activated (for test purposes, for instance) even with the associated power stage in an off state: test pulses of off-state diagnosis are visible, along with reliable redundant current monitor measurements made available, for instance on SPI registers.

Possible application of embodiments to valve drivers in the automotive sector is discussed herein for the sake of clarity and ease of explanation. Those of skill in the art will otherwise appreciate that the embodiments are not limited to that exemplary application.

In an embodiments, a circuit for use, e.g., in driving solenoid loads in motor vehicles comprises a controller configured to produce a pulse-width-modulated (PWM) signal to control current supply to an electrical load. Redundant current measurement circuitry comprises a first current sensing path and a second current sensing path to measure the current in the electrical load and provide first and second current measurement signals. Monitor circuitry coupled to the current measurement circuitry asserts a current monitor signal in response to the first and second current measurement signals being found to be matching. The monitor circuitry is configured to detect the absence of an asserted current monitor signal prior to expiry of a threshold time interval and force the controller to produce, prior to expiry of the threshold time interval, at least one PWM pulse having a controlled non-0% duty-cycle. This may be either a pulse having a duty-cycle different the duty cycle of a PWM signal currently generated (ON-state operation) or a pulse forced while the circuit is not currently generating a PWM signal (OFF-state operation).

BRIEF DESCRIPTION OF THE DRAWINGS

One or more embodiments will now be described, by way of example only, with reference to the annexed figures, wherein:

FIGS. 2 and 3 are diagrams exemplary of possible time behaviors of signals which may occur in embodiments as discussed herein.

DETAILED DESCRIPTION OF ILLUSTRATIVE EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment.

Moreover, particular conformations, structures, or characteristics may be combined in any adequate way in one or more embodiments.

The headings/references used herein are provided merely for convenience and hence do not define the extent of protection or the scope of the embodiments.

Transmission control units implemented as integrated circuits (ICs) for use—by way of non-limiting example—in the automotive sector include valve drivers as important circuit blocks. These blocks can be used to drive solenoid loads with a controlled current using current sense and regulation circuitry that drives the load in PWM operation.

A high level of safety (ASIL-D compliant, for instance) and a high accuracy of the regulated current (up to +/−0.25%) are desirable features which may involve the implementation of a redundant current monitor capable of revealing the presence of possible faults in the main current sensing and regulation path.

Figure 1:
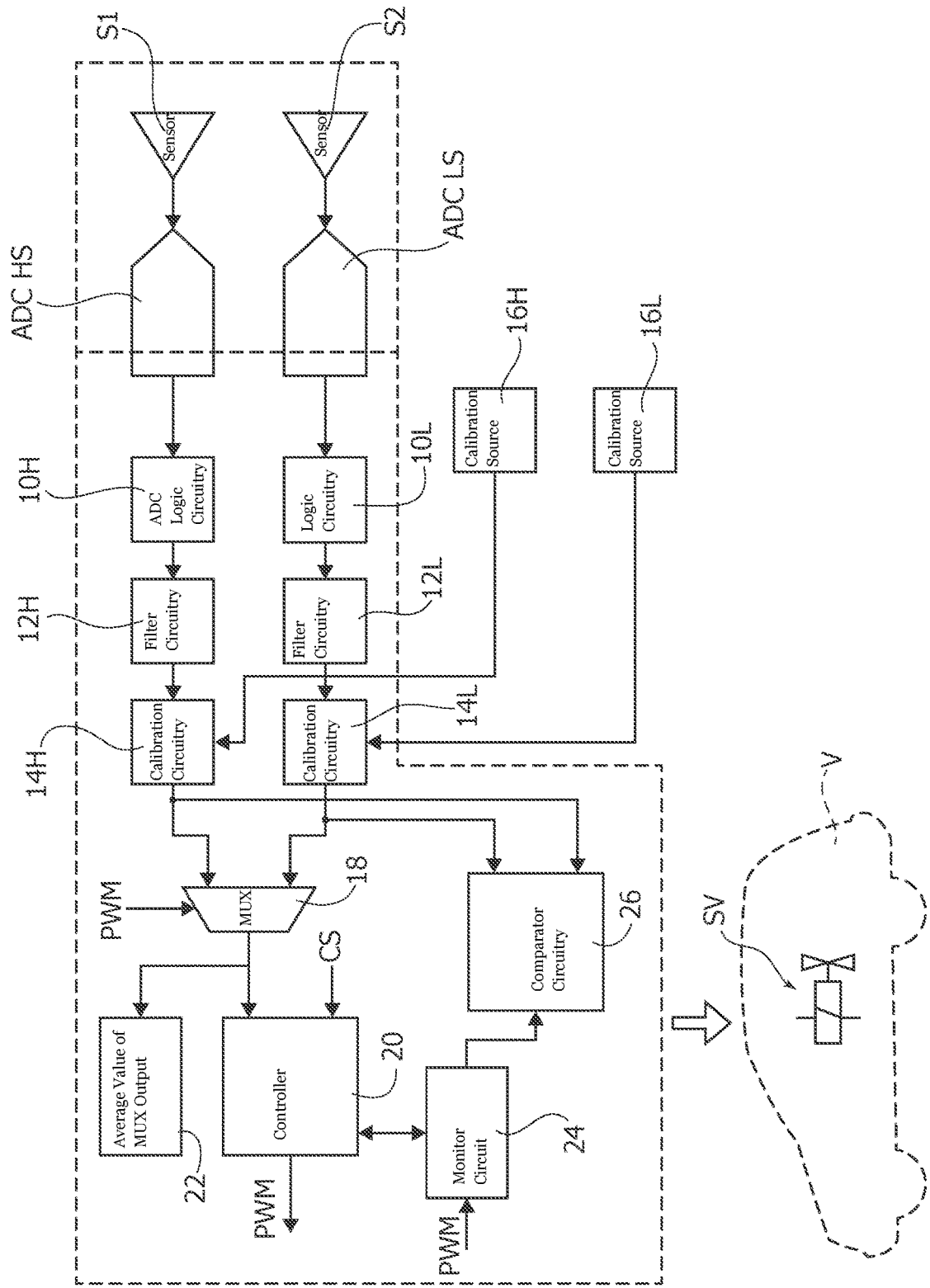
FIG. 1 is a block diagram illustrative of implementation of independent HS/LS current measurement paths in a valve driver.

FIG. 1 shows a block diagram exemplary of an arrangement which can be used to drive a solenoid load (a solenoid valve SV in a motor vehicle V, for instance) with a controlled current using current sense and regulation circuitry that drives the load in PWM operation.

In general terms, such a control scheme is conventional in the art. This makes it unnecessary to provide a detailed description within the framework of this disclosure, which, unless the context indicates otherwise, is mainly concerned with redundant current monitoring in such a control scheme.

An arrangement as exemplified in FIG. 1 comprises current sensors S1, S2 for high-side (HS) and low-side (LS), respectively. The sensors S1 and S2 co-operate with (high-resolution) analog-to-digital converters or, briefly, ADCs, ADC HS and ADC LS, that convert sensing voltages as provided by the sensors S1 and S2 into digital codes.

In current measurement for valve driver blocks independency between LS and HS paths is desirable.

For that reason, two (completely) independent signal paths are provided in a measurement chain as illustrated in FIG. 1, including two sensors S1, S2.

Independent HS and LS paths as illustrated in FIG. 1 facilitate achieving compliance with ASIL-D specifications and independency of redundant current monitoring (with HS and LS adapted to be compared with each other).

For instance, as illustrated in FIG. 1, a (single) digital channel to be coupled to an analog channel comprising two sensors S1, S2 and two ADCs, namely ADC HS and ADC LS, comprises:

ADC logic circuitry 10H (high) and 10L (low),
filter circuitry 12H and 12L, and
calibration circuitry 14H and 14L in turn expected to co-operate with (external) calibration sources 16H, 16L.

An arrangement as illustrated in FIG. 1 also comprises a multiplexer 18 driven by an on-off (pulse-width modulated) signal PWM to alternately supply the outputs from the high-side branch and low-side branch discussed previously (essentially the outputs from the calibration circuitry 14H and 14L) to a controller 20 (for instance, a proportional-integral or PI controller) sensitive to a current set point CS and configured to generate a pulse-width modulated signal PWM as a function of the signal provided via the multiplexer 18.

The (average) value (here represented in a general way by a block 22) of the output from the multiplexer 18 is indicative of the average value of the entity sensed by the sensors S1 and S2, that is, in the exemplary case considered here, of the average current provided to the load (here, SV) by the high-side branch and low-side branch discussed previously.

As illustrated, a PWM monitor circuit 24 receives a PWM feedback signal from the input analog channel in order to verify that such a PWM signal at the output of the valve driver is consistent—for instance, equal, with a certain margin of error—with the value imposed by the controller block 20 (a PI controller, for instance).

Such a signal can be provided by an analog comparator that compares the output voltage with the voltage of the supply (battery). This may take place, for instance, with a threshold having a value which is half the battery value.

This additional safety function facilitates complying with ASIL-D specifications according to ISO26262.

The device may be configured to provide (on SPI registers, for instance) the duty-cycle measured by the block 24 and a microcontroller—at the system level—can compare the measured values with theoretical values set by the block 20 (which can also be read from SPI registers). If the difference exceeds a certain threshold, the microcontroller may set the system to a "safe" state.

As illustrated, comparator circuitry 26 can be coupled to the outputs from the high-side branch and low-side branch discussed previously (essentially the outputs from the calibration circuitry 14H and 14L) with the capability of comparing these two outputs (and thus the values sensed by the sensors S1 and S2).

The information provided by the block 24 can be used by the block 26 (high-side, low-side compare) for enhanced diagnostics purposes as discussed in the following, that is in order to facilitate compliance with specifications by relying on a redundant current measurement path and a monitor configured to check the main current measurement path versus the redundant current measurement path.

A driver relying on architecture as illustrated in FIG. 1 can be incorporated, for instance, in a transmission control unit for passenger vehicles and (PVs) and commercial vehicles (CVs). Valve driver stages as implemented in transmission and braking control units are exemplary of such a possible application.

It is otherwise once more noted that reference to such a possible application is merely exemplary and non-limiting of the embodiments. One or more embodiments can in fact be generally applied to circuits for which a high level of safety (up to ASIL-D, for instance) is desirable, which may result in redundancy for each function.

A solution as illustrated in FIG. 1 is exemplary of the implementation of HS-LS comparison, which facilitates complying with specifications with increased flexibility and appreciable savings in terms of production cost.

It is noted that the mixed analog/digital implementation of HS-LS comparison as illustrated in detail herein is merely exemplary of one possible way of applying redundant current measurement paths: for instance, certain conventional solutions involve duplicating the whole LS and HS paths. In any case, solutions as illustrated in FIG. 1 share with more conventional solutions certain limitations which may arise in "corner" cases involving a PWM duty-cycle close to 0% or 100%.

By way of Summary:

in general terms, complying with a certain safety level specification (ASIL-D, for instance) for a valve driver used to sense and regulate, through PWM operation, a current in an electrical load (a solenoid load for transmission applications in the automotive sector, for instance) may involve using a redundant current measurement path;

a HS-LS compare monitor as exemplified in FIG. 1 based on a mixed analog/digital implementation and conventional solutions involve duplicating the whole LS and HS paths may exhibit limitations in adequately measuring the current when the PWM duty-cycle comes close to "corner" conditions.

For Instance:

in the presence of a PWM duty cycle value close to 0% (such as 5% or lower), the active stage may not be able to measure the current, and in the presence of a PWM duty cycle value close to 100% (such as 95% or higher), the recirculation stage may not be able to measure the current.

The designations "active stage" and "recirculation stage" apply differently as a function of the configuration adopted for an application.

For instance, in a low-side (LS) Configuration:

the active stage may comprise the low-side circuitry including the associated measurement path, namely the sensor S2, the converter ADC LS, the logic circuitry 10L, the filter circuitry 12L, and the calibration circuitry 14L expected to co-operate with the calibration source 16L; and the recirculation stage may comprise the high-side circuitry including the associated measurement path, namely the sensor S1, the converter ADC HS, the logic circuitry 10H, the filter circuitry 12H, and the calibration circuitry 14H expected to co-operate with the calibration source 16H.

In a complementary manner, in a high-side (HS) configuration:

the active stage may comprise the high-side circuitry including the associated measurement path, namely the sensor S1, the converter ADC HS converter, the logic circuitry 10H, the filter circuitry 12H, and the calibration circuitry 14H expected to co-operate with the calibration source 16H; and the recirculation stage may comprise the low-side circuitry including the associated measurement path, namely the sensor S2, the converter ADC LS, the logic circuitry 10L, the filter circuitry 12L, and the calibration circuitry 14L expected to co-operate with the calibration source 16L.

As discussed, proper operation of an arrangement as considered herein may benefit from a reliable redundant current measurement result, which facilitates achieving desired FTTI (Fault Tolerant Time Interval) performance, for instance equal to 20 ms.

By referring to the PWM signal as generated by a controller such as the controller 20 in FIG. 1 (for instance, this may be a PI controller configured to operate as a function of a desired current set-point and the average current measured via the circuitry discussed in the foregoing), in the presence of a duty-cycle close to 0% (very low load current) or in the presence of a duty-cycle value close to 100% (very high load current) for a time exceeding the FTTI value set, a safety violation may be declared.

In these conditions, providing an adequate current measurement within the $T_{ON}$ or $T_{OFF}$ intervals of the PWM signal becomes hardly feasible due to the intrinsic blanking time which separates the active state from the recirculation state and the recirculation state from the active state during the transitions between these states in the valve driver.

Stated otherwise, in the presence of a duty-cycle of the PWM signal close to 0% (e.g., 5% or lower) or 100% (e.g., 95% or higher), either one of $T_{ON}$ and $T_{OFF}$ becomes "too short" to provide an adequate current measurement.

It is noted that such a blanking time may result from various contributions, namely:

an analog slew-rate time (T_SR) taken in making the transition and reaching full "on" operation of the power stage, and an intrinsic digital delay time (T_ADC), such as the freeze time and start-up time of the ADC(s), ADC HS, ADS LS that convert into a digital code the analog current sensed at S1 and S2.

This blanking time may vary as a function of the specific implementation.

Values of about 5 microseconds or higher are observed in current applications, which may result in adequate operation being limited in a range of duty-cycle values between about 5% and 95% in the case of a PWM signal having a frequency of 10 kHz as is current for exemplary applications as discussed herein.

It is noted that such a limitation may become increasingly critical in recent applications using PWM frequencies increased up to 20 kHz.

In those cases where no valid redundant current measurement is available within a defined FTTI, a flag can be asserted in the communication interface register with a MCU (MicroController Unit, such as a SPI interface) so that the fault is communicated to the MCU.

Two possible scenarios can derive as a function of the safety level of the application:

in high-level safety applications, operation may be potentially stopped even if no fault is actually present, in low-level safety applications, operation may continue even in the presence of a fault.

In both instances, unavailability of a reliable monitoring action may lead to critical situations.

In one or more embodiments an adequate redundant current monitor measurement is facilitated even in the presence of "corner" duty-cycle values (notionally 0% or 100%) via an enhanced diagnosis function. That function is able, under certain conditions, to force or impose a duty-cycle value which facilitates obtaining a valid current measurement.

In one or more embodiments such an enhanced diagnosis function can be implemented taking advantage of a PWM monitor circuit such as 24 in FIG. 1 (for instance, by programming the monitor circuit in a manner known per se to those of skill in the art). As discussed, the monitor circuit 24 may be (already) configured to receive a PWM feedback signal from the input analog channel in order to verify that such a PWM signal at the output of the valve driver is consistent—for instance, equal, with a certain margin of error—with the value imposed by the controller block 20.

For instance, the diagnostic function may rely on information provided by the circuit 24: in the presence of a "corner" duty-cycle, the information provided by the circuit 24 can be exploited in the block 20 to "force" a duty-cycle value adequate to perform a satisfactory redundant current monitor function within a FTTI (block 26). Stated otherwise, a diagnostic function as exemplified herein can be performed via the blocks 20, 24 which enable the block 26 to perform a satisfactory redundant current monitor function (via HS-LS compare, as exemplified herein, or via other methods known to those of skill in the art).

Such a diagnosis action can be designed to work both in an ON-state (that is, during PWM operation) and in an OFF-state (that is with the current set-point CS to the controller 20 equal to zero).

This facilitates achieving (very) high application flexibility because the redundant current monitor measurement can be made available even before the load is actually driven in operation.

In one or more embodiments, ON-state diagnosis may be based on correct HS-LS compare (that is, redundant current monitor) measurement on each PWM pulse. This result can be achieved in a manner known per se, for instance thanks to the information provided by comparators as currently available in valve drivers: see for instance the comparator circuitry 26 which is coupled to the outputs from the high-side branch and low-side branch discussed previously in connection with FIG. 1.

For instance, in one or more embodiments, in case no valid HS-LS compare measurement is available within a defined FTTI (that is, after a certain number of PWM waveforms over a total time shorter than FTTI) due to a very low duty-cycle, in the vicinity of 0%, the duty-cycle is increased of an amount which facilitates obtaining a valid HS-LS compare measurement.

In the presence of a PWM frequency in the order of 10 kHz and a FTTI value in the order of tens of ms (20 ms, for instance), increasing the duty-cycle of e.g. one PWM cycle (the one just before the end of FTTI, for instance) will have a negligible impact on the average value of the regulated current.

The possibility also exists of providing a flag to a MCU (the controller 20, for instance) to indicate that such a diagnosis has been automatically activated during the regulation loop.

An ON-state functionality as described is illustrated in FIG. 2.

The diagrams in FIG. 2 illustrate, against a common time (abscissa) scale t, possible time behaviors of:

the HS-LS compare signal HS-LS COMP (valid=1) from the comparator block 26, the PWM signal as generated by the controller 20 starting from the start of actuation time SA (t=0).

As exemplified in FIG. 2, the duty-cycle of the PWM signal is increased for enough time (possibly just a single PWM pulse) to have a valid redundant current monitor measurement before the FTTI set expires. The deviation induced in the average current was found to be negligible.

In one or more embodiments, the same basic criteria apply, in a complementary way, in case no valid HS-LS compare measurement is available within a defined FTTI (that is, after a certain number of PWM waveforms over a total time shorter than FTTI) due to a duty-cycle, in the vicinity of 100%, with the duty-cycle decreased of an amount which facilitates obtaining a valid HS-LS compare measurement.

For instance, the duty-cycle can be reduced (for instance, as a function of the slew-rate time T_SR and the intrinsic digital delay time T_ADC discussed previously—which can be assumed to be parameters known to the blocks 20 and 26) to a value adequate to perform a satisfactory redundant current monitor function (via HS-LS compare as exemplified herein or other methods known to those of skill in the art).

Here again, in the presence of a PWM frequency in the order of 10 kHz and a FTTI value in the order of tens of ms (20 ms, for instance), decreasing the duty-cycle of e.g. one PWM cycle (the one just before the end of FTTI, for instance) will have a negligible impact on the average value of the regulated current.

The possibility again exists of providing a flag to a MCU (the controller 20, for instance) to indicate that such a diagnosis has been automatically activated during the regulation loop.

An ON-state functionality as described is illustrated in FIG. 2 in the exemplary case of a duty-cycle of the PWM signal which is too small (nearly 0%) and is increased for enough time (possibly just a single PWM pulse) to perform a satisfactory redundant current monitor function.

As noted, the same principles apply, mutatis mutandis, in the case of a duty-cycle of the PWM signal which is too large (nearly 100%) and is decreased for enough time (possibly just a single PWM pulse) to perform a satisfactory redundant current monitor function.

The diagrams in FIG. 2 illustrate, against a common time (abscissa) scale t, possible time behaviors of:

the HS-LS compare signal HS-LS COMP (valid=1) from the comparator block 26, the PWM signal as generated by the controller 20 starting from the start of actuation time SA (t=0).

The duty-cycle of the PWM signal is increased (as exemplified in FIG. 2) or decreased for enough time (possibly just a single PWM pulse) to have a valid redundant current monitor measurement before the FTTI set expires. The deviation induced in the average current was found to be negligible.

In one or more embodiments, OFF-state diagnosis can be automatically activated (even) when valve driver power stage is enabled with set-point CS equal to zero (no current flowing into the load—recirculation path always enabled with duty-cycle fixed to 0%).

Under these circumstances, at every FTTI a test pulse can be applied to the channel providing an on-state sufficient to obtain a valid HS-LS compare measurement.

In this case, a MCU (a controller such as 20) can continuously detect a possible fault even if the channel is not used at the moment, thus providing additional diagnostic coverage in comparison with a standard implementation in so far as a fault can be detected before the first actuation of the load.

An OFF-state functionality as described is illustrated in FIG. 3.

The diagrams in FIG. 3 illustrate, against a common time (abscissa) scale t, possible time behaviors of:

the HS-LS compare signal HS-LS COMP (valid=1) from the comparator block 26, the PWM signal as generated by the controller 20, again referring to a notional start of actuation time (t=0) positively not referenced as such insofar as corresponding to the valve driver power stage being enabled with set-point CS equal to zero (recirculation path always enabled with duty-cycle fixed to 0%, with no current flowing into the load and thus no "actuation" intended).

As illustrated in FIG. 3, a duty-cycle forced to "1" for a short time (possibly just a single PWM pulse before FTTI expires) is enough to perform a valid redundant current measurement with a negligible current flow through the load (no load actuation).

One or more embodiments facilitate automatically detecting, thanks to the information provided by analog comparators typically available in valve drivers, whether a valid current measurement is available in a redundant current monitor. If the absence of such a valid measurement is diagnosed, a longer (higher) PWM duty-cycle can be forced before FTTI from last valid measurement expires and provide a flag when this action is effected used in the control loop.

One or more embodiments can be applied both in HS-LS compare and other conventional redundant current monitor arrangements.

One or more embodiments were found to be effective in implementing enhanced diagnosis, at very low load current, where duty-cycle values are critical and a valid measurement cannot be obtained with redundant current monitors leading current measurement outside specification limits (with the risk of fault being wrongly detected or left undetected).

It will be otherwise appreciated that the embodiments exemplifies herein are largely "transparent" to the specific type of sensing and control performed in blocks such as S1, S2 and 20 and, more generally, to the specific application contemplated for the drive circuit including the redundant current monitor discussed herein.

Figure 4:
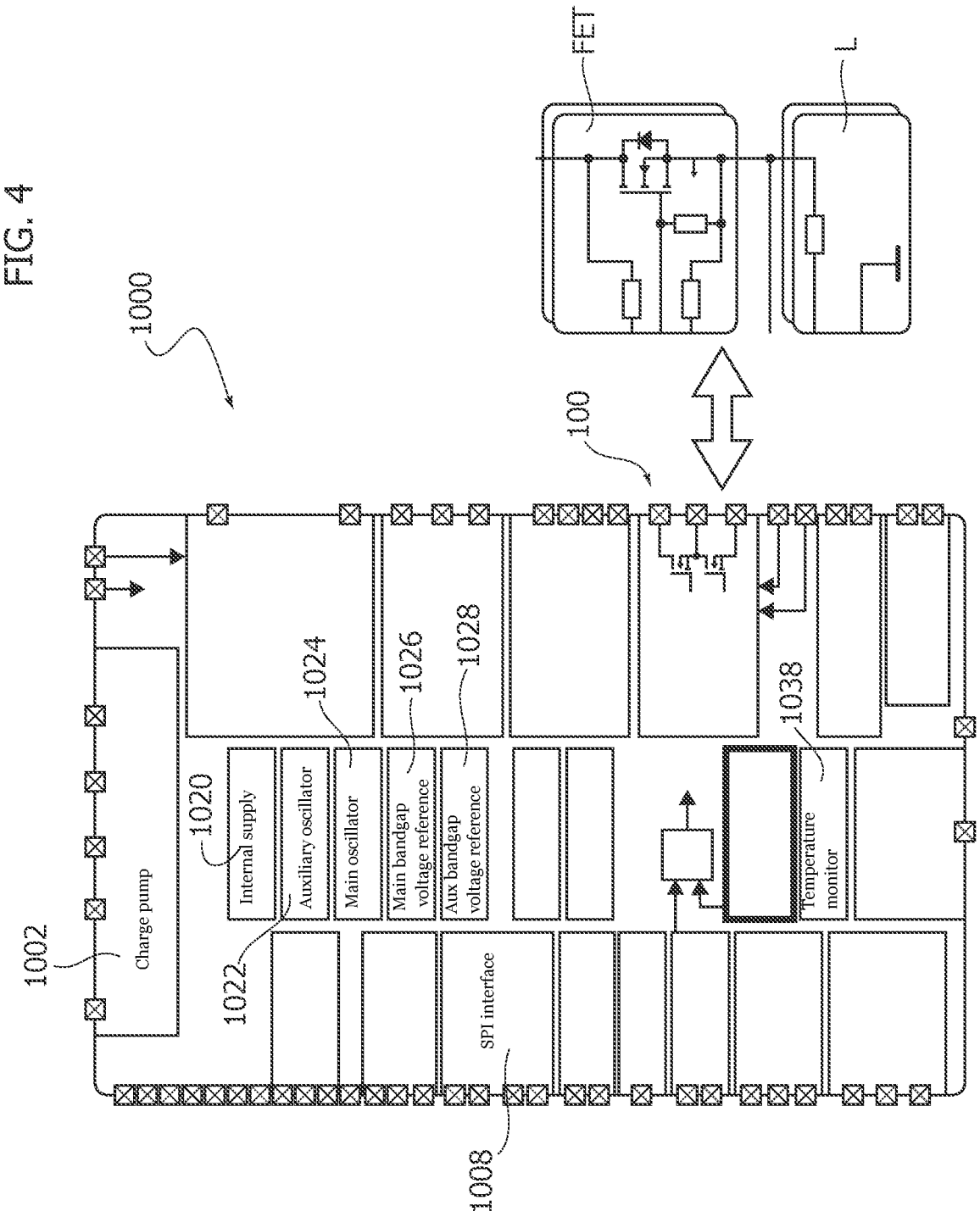
FIG. 4 is a block diagram exemplary of the possible incorporation of embodiments in a transmission control unit.

FIG. 4 is a block diagram exemplary of the possible incorporation of embodiments as described herein (generally designated 100) in a transmission control unit 1000 for passenger vehicles and (PVs) and commercial vehicles (CVs).

The following designations apply to certain blocks visible in FIG. 4:
- 1002—Charge pump
- 1008—SPI interface
- 1020—Internal supply
- 1022—Auxiliary oscillator
- 1024—Main oscillator
- 1026 and 1028—Main and auxiliary bandgap voltage reference
- 1038—Temperature monitor (cooperating with one or more current control drivers 100 as discussed previously)
- FET—field effect transistors driven by driver 100
- L—load(s)—such as solenoid valve(s) supplied by FET.

Those of skill in the art will otherwise note that a transmission control unit 1000 as illustrated in FIG. 3 may include various other blocks/elements which are per se conventional in the art and are not expressly mentioned and/or referenced insofar as they are not of specific importance for the embodiments.

A circuit as exemplified herein may comprise:

a controller (for instance, 20) configured to produce a pulse-width-modulated signal (for instance, PWM) to control current supply to an electrical load (for instance, SV), the pulse-width-modulated signal having a duty-cycle, redundant current measurement circuitry (for instance, S1, 10H, 12H, 14H; S2, 10L, 12L, 14L) configured to measure the current in the electrical load and provide a first and a second current measurement signal, monitor circuitry (for instance, 24, 26) coupled to the redundant current measurement circuitry, the monitor circuitry configured to assert (e.g., high) a current monitor signal (for instance, HS-LS COMP) in response to the first and second current measurement signals being found to be matching with each other, wherein the monitor circuitry is configured to:

detect the absence of an asserted current monitor signal prior to expiry of a threshold time interval (for instance, FTTI), and in response to detecting the absence of the asserted current monitor signal, force the controller to produce, prior to expiry of the threshold time interval, at least one pulse-width-modulated signal pulse having a controlled duty-cycle.

As exemplified herein this may occur in ON-state operation (see FIG. 2, for instance) and in OFF-state operation (see FIG. 3, for instance).

In a circuit as exemplified herein, the monitor circuitry may be configured to:

detect the absence of an asserted current monitor signal prior to expiry of a threshold time interval with the controller configured to produce (in ON-state operation) a pulse-width-modulated signal having a first non-0% duty-cycle, and in response to detecting the absence of the asserted current monitor, force the controller to produce, prior to expiry of the threshold time interval, at least one pulse of the pulse-width-modulated signal having a second non-0% duty-cycle different from the first non-0% duty-cycle.

In a circuit as exemplified herein (see FIG. 2, for instance), the monitor circuitry may be configured to force the controller to produce, prior to expiry of the threshold time interval, a single pulse of the pulse-width-modulated signal having a second non-0% duty-cycle different from the first non-0% duty-cycle.

In a circuit as exemplified herein (see again FIG. 2, for instance), the single pulse in the pulse-width-modulated signal may be the last pulse in the pulse-width-modulated signal prior to expiry of the threshold time interval (for instance, FTTI).

In a circuit as exemplified herein, the controller may be configured to produce a pulse-width-modulated signal having a first non-0% duty-cycle lying in a lower range adjacent 0% (duty-cycle near 0%) or in an upper range adjacent 100% (duty-cycle near 100%).

In a circuit as exemplified herein, the monitor circuitry may thus be configured to:

in response to detecting the absence of the asserted current monitor, force the controller to produce, prior to expiry of the threshold time interval, at least one pulse of the pulse-width-modulated signal having:

a second non-0% duty-cycle higher than the first non-0% duty-cycle in response to the pulse-width-modulated signal having a first non-0% duty-cycle lying in the lower range adjacent 0% (that is, increasing the duty-cycle), and/or a second non-0% duty-cycle lower than the first non-0% duty-cycle in response to the pulse-width-modulated signal (PWM) having a first non-0% duty-cycle lying in the upper range adjacent 100% (that is, decreasing the duty-cycle).

It is noted that, irrespective of how current measurement is performed (HS-LS compare or full redundancy, for instance), the amount the duty cycle is increased or decreased in order to facilitate an adequate current measurement will ultimately depend on the specific implementation/configuration. By way of (non-limiting) reference, an adequate measurement of the (delta) current may be facilitated by having a PWM active time equal to or higher than the blanking time (T_SR plus T_ADC) discussed in the foregoing.

In a circuit as exemplified herein:

the current measurement circuitry may comprise a first current sensing path (for instance, S1, 10H, 12H, 14H) and a second current sensing path (for instance, S2, 10L, 12L, 14L) configured to measure the current in the electrical load and provide a first and a second current measurement signal, respectively, the monitor circuitry may be configured to perform a comparison (for instance, at 26) of the first and second current measurement signals and to assert the current monitor signal in response to the comparison indicating the first and second current measurement signals being matching with each other.

A system as exemplified herein (for instance, 1000), may comprise:

a circuit as exemplified herein, and at least one electrical load coupled to the circuit and configured to receive current supply controlled via the pulse-width-modulated signal produced by the controller.

A method of operating a circuit or a system as exemplified herein may comprise operating the controller to produce a pulse-width-modulated signal to control current supply to an electrical load, the pulse-width-modulated signal having a duty-cycle, wherein, in response to detecting the absence of the asserted current monitor signal (for instance, HS-LS COMP) prior to expiry of a threshold time interval (for instance, FTTI), the monitor circuitry forces the controller to produce, prior to expiry of the threshold time interval, at least one pulse-width-modulated signal pulse having a controlled duty-cycle (see, for instance, ON-state operation, as exemplified in FIG. 2, or OFF-state operation, as exemplified in FIG. 2).

Without prejudice to the underlying principles, the details and embodiments may vary, even significantly, with respect to what has been described by way of example only without departing from the extent of protection.

The extent of protection is determined by the annexed claims.

What is claimed is:

1. An electronic circuit comprising:
    a controller configured to produce a pulse-width-modulated (PWM) signal to control a first current of an electrical load;
    a redundant current measurement circuit configured to measure the first current and provide first and second current measurement signal; and
    a monitor circuit coupled to the redundant current measurement circuit, the monitor circuit configured to assert a current monitor signal in response to the first and second current measurement signals being found to be matching with each other, wherein the monitor circuit is configured to:
        detect an absence of the asserted current monitor signal prior to expiry of a threshold time interval, and
        in response to detecting the absence of the asserted current monitor signal, force the controller to produce, prior to expiry of the threshold time interval, a first PWM signal pulse having a controlled duty-cycle.

2. The electronic circuit of claim 1, wherein the monitor circuit is configured to:
    detect the absence of the asserted current monitor signal prior to expiry of the threshold time interval with the controller configured to produce the PWM signal having a first non-0% duty-cycle; and
    in response to detecting the absence of the asserted current monitor signal, force the controller to produce, prior to expiry of the threshold time interval, the first PWM signal pulse having a second non-0% duty-cycle different from the first non-0% duty-cycle.

3. The electronic circuit of claim 2, wherein the monitor circuit is configured to force the controller to produce, prior to expiry of the threshold time interval, a single PWM pulse of the PWM signal having the second non-0% duty-cycle, wherein the first PWM signal pulse is the single PWM pulse.

4. The electronic circuit of claim 3, wherein the single PWM pulse is the last pulse in the PWM signal prior to expiry of the threshold time interval.

5. The electronic circuit of claim 2, wherein the first non-0% duty-cycle is in a lower range adjacent 0% or in an upper range adjacent 100%, wherein the second non-0% duty-cycle is higher than the first non-0% duty-cycle when the first non-0% duty-cycle is in a lower range adjacent 0%, and wherein the second non-0% duty-cycle is lower than the first non-0% duty-cycle when the first non-0% duty-cycle is in a higher range adjacent 100%.

6. The electronic circuit of claim 1, wherein:
    the redundant current measurement circuit comprises a first current sensing path and a second current sensing path configured to measure the first current and provide the first and second current measurement signals, respectively; and
    the monitor circuit is configured to perform a comparison of the first and second current measurement signals and to assert the current monitor signal in response to the comparison indicating the first and second current measurement signals being matching with each other.

7. A system comprising:
    an electrical load;
    a controller configured to produce a pulse-width-modulated (PWM) signal to control a first current of the electrical load;
    a redundant current measurement circuit configured to measure the first current and provide first and second current measurement signal; and
    a monitor circuit coupled to the redundant current measurement circuit, the monitor circuit configured to assert a current monitor signal in response to the first and second current measurement signals being found to be matching with each other, wherein the monitor circuit is configured to:
        detect an absence of the asserted current monitor signal prior to expiry of a threshold time interval, and
        in response to detecting the absence of the asserted current monitor signal, force the controller to produce, prior to expiry of the threshold time interval, a first PWM signal pulse having a controlled duty-cycle.

8. The system of claim 7, wherein the electronical load comprises a solenoid valve.

9. The system of claim 8, wherein the solenoid valve is disposed inside a motor vehicle.

10. The system of claim 7, wherein the system comprises a transmission control unit for a motor vehicle.

11. The system of claim 7, wherein the monitor circuit is configured to:
    detect the absence of the asserted current monitor signal prior to expiry of the threshold time interval with the controller configured to produce the PWM signal having a first non-0% duty-cycle; and
    in response to detecting the absence of the asserted current monitor signal, force the controller to produce, prior to expiry of the threshold time interval, the first PWM signal pulse having a second non-0% duty-cycle different from the first non-0% duty-cycle.

12. The system of claim 11, wherein the monitor circuit is configured to force the controller to produce, prior to expiry of the threshold time interval, a single PWM pulse of the PWM signal having the second non-0% duty-cycle, wherein the first PWM signal pulse is the single PWM pulse.

13. The system of claim 12, wherein the single PWM pulse is the last pulse in the PWM signal prior to expiry of the threshold time interval.

14. A method comprising:
producing a pulse-width-modulated (PWM) signal to control a first current of an electrical load;
measuring the first current with first and second paths and respectively providing first and second current measurement signals based on the first current measured using the first and second paths;
asserting a current monitor signal in response to the first and second current measurement signals being found to be matching with each other;
detecting an absence of the asserted current monitor signal prior to expiry of a threshold time interval; and
in response to detecting the absence of the asserted current monitor signal, producing, prior to expiry of the threshold time interval, a first PWM signal pulse having a controlled duty-cycle.

15. The method of claim 14, wherein detecting the absence of the asserted current monitor signal prior to expiry of the threshold time interval comprises detecting the absence of the asserted current monitor signal prior to expiry of the threshold time interval while the PWM signal has a first duty-cycle, and, in response to detecting the absence of the asserted current monitor signal, producing, prior to expiry of the threshold time interval, the first PWM signal pulse having a second duty-cycle different from the first duty-cycle.

16. The method of claim 15, wherein producing the first PWM signal pulse comprises producing a single PWM signal pulse prior to expiry of the threshold time interval.

17. The method of claim 16, wherein the second duty-cycle is higher than the first duty-cycle when the first duty-cycle is below 50%, and when the second duty-cycle is lower than the first duty-cycle when the first duty-cycle is higher than 50%.

18. The method of claim 17, wherein the first duty-cycle is below 5% or above 95%.

19. The method of claim 14, wherein the threshold time interval is about 20 ms.

20. The method of claim 14, wherein the PWM signal has a frequency between 10 kHz and 20 kHz.

* * * * *